United States Patent
Watkins

(10) Patent No.: US 6,745,358 B1
(45) Date of Patent: Jun. 1, 2004

(54) ENHANCED FAULT COVERAGE

(75) Inventor: Daniel R. Watkins, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 404 days.

(21) Appl. No.: 09/997,757

(22) Filed: Nov. 30, 2001

(51) Int. Cl.[7] .............................................. G01R 31/28
(52) U.S. Cl. ...................................... 714/726; 714/745
(58) Field of Search ................................ 702/187, 181; 714/726, 724, 727, 729, 745; 716/18

(56) References Cited

U.S. PATENT DOCUMENTS

| | | | | |
|---|---|---|---|---|
| 4,937,765 A | * | 6/1990 | Shupe et al. ................. | 702/187 |
| 5,748,497 A | * | 5/1998 | Scott et al. .................. | 702/181 |
| 5,796,990 A | | 8/1998 | Erle et al. ................... | 395/500 |
| 6,059,451 A | * | 5/2000 | Scott et al. .................. | 714/726 |
| 6,151,694 A | * | 11/2000 | Nozuyama ................... | 714/724 |
| 6,301,688 B1 | | 10/2001 | Roy ............................... | 716/4 |
| 6,363,520 B1 | * | 3/2002 | Boubezari et al. ............ | 716/18 |

* cited by examiner

*Primary Examiner*—David Ton
(74) *Attorney, Agent, or Firm*—Luedeka, Neely & Graham

(57) ABSTRACT

A tool and method for increasing fault coverage of an integrated circuit. The tool includes a key nodes detection device for matching key nodes to a fault grading report list of undetected nodes, a multi-sites selection device for reading a layout file of available multi unit sites for the integrated circuit, a site matching device for matching available multi-unit sites to key undetected nodes, and a netlist generation device for building logic functions in the available multi-unit sites for connection to the key undetected nodes. Use of the invention enables increased fault coverage of integrated circuit circuits for little or no added expense.

21 Claims, 6 Drawing Sheets

ENHANCED FAULT COVERAGE

FIELD

This invention relates to the field of integrated circuit fabrication. More particularly, this invention relates to methods and apparatuses for providing full fault coverage for an integrated circuit thereby increasing product yield.

BACKGROUND

Integrated circuits are tested to determine the existence of defects which may introduce faults in the integrated circuit during use. Faults are typically mapped from physical faults to logical faults. Logical faults are distinguished on the basis of those faults which degrade performance and those faults which are fatal and completely stop the integrated circuit from working. After logic simulation of the integrated circuit is complete, fault simulation is conducted to see what happens when faults are deliberately introduced into the integrated circuit. Fault simulation is conducted using a set of test vectors which use inputs to the primary input pins of the integrated circuit to obtain predetermined outputs from the output pins of the integrated circuit.

Because of the complexity of the circuits, some of the circuits are inaccessible and cannot be tested regardless of the number of test vectors used. Other circuits may require a long and complicated test pattern sequence or high number of vectors to adequately test the circuit. As circuits become larger and more complex, the ability and economic feasibility of completely testing the circuits to find all detectable faults continues to decrease. Hence, fault models have been designed to provide a statistical number of faults in a circuit from the output data of the fault simulation tests. The term "fault coverage" is used to specify the ratio between the number of faults detectable and the total number of faults in the assumed fault universe for a circuit based on the fault model.

The number of potentially defective integrated circuits is determined from the fault coverage report. As the fault coverage value decreases, the number of undetected defective integrated circuits increases. Hence, there is a risk that a higher number of defective integrated circuits will be shipped than if all of the detectable faults had been detected by the simulation software. Shipping defective integrated circuits may result in returns which may have to be reprocessed and retested to determine the source of the failures. In the alternative, an additional fault testing tool may be used to increase the fault coverage. However, it is expected that such a tool will add considerable expense to integrated circuit production costs and result in only an incremental increase in the fault coverage. Thus there exists a need for a method for increasing the fault coverage without significantly increasing the production costs of integrated circuits.

SUMMARY

The above and other needs are met by a method for increasing a fault coverage of an integrated circuit having a predetermined functionality. The method includes the steps of providing an integrated circuit layout on a substrate including functional units, free space and a first netlist, providing a fault grading report output including a number of unobserved faults and identified undetected nodes, providing a priority task list of key undetected nodes from the identified undetected nodes, selecting key undetected nodes to be covered with logic functions, selecting multi-unit sites in the free space adjacent the key undetected nodes to provide a locations list for the logic functions for connection to the key undetected nodes, generating a second netlist including the locations list for the logic functions, generating a metallization design for the integrated circuit according to the second netlist, and running an integrated circuit simulation to determine if the predetermined desired functionality for the integrated circuit is achieved.

In another aspect, the invention provides a tool for increasing fault coverage of an integrated circuit. The tool includes a key nodes detection device for matching key nodes to a fault grading report list of undetected nodes, a multi-sites selection device for reading a layout file of available multi-unit sites for the integrated circuit, a site matching device for matching available multi-unit sites to key undetected nodes, and a netlist generation device for building logic functions in the available multi-unit sites for connection to the key undetected nodes. The tool also builds circuitry to enable access to the nodes.

An advantage of the invention is that it enables use of existing substrate area for improving fault coverage of an integrated circuit without significantly increasing the layout congestion of the integrated circuit. Another advantage of the invention is that it provides a method and tool for achieving up to 100% fault coverage of an integrated circuit layout for an integrated circuit having sufficient free space adjacent undetected nodes. Still another advantage of the invention is that the tool for increasing fault coverage may be used before or after metallization of the substrate. The methods and apparatus of this invention may be applied to a wide variety of integrated circuits to reduce the number of faulty parts shipped to customers.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
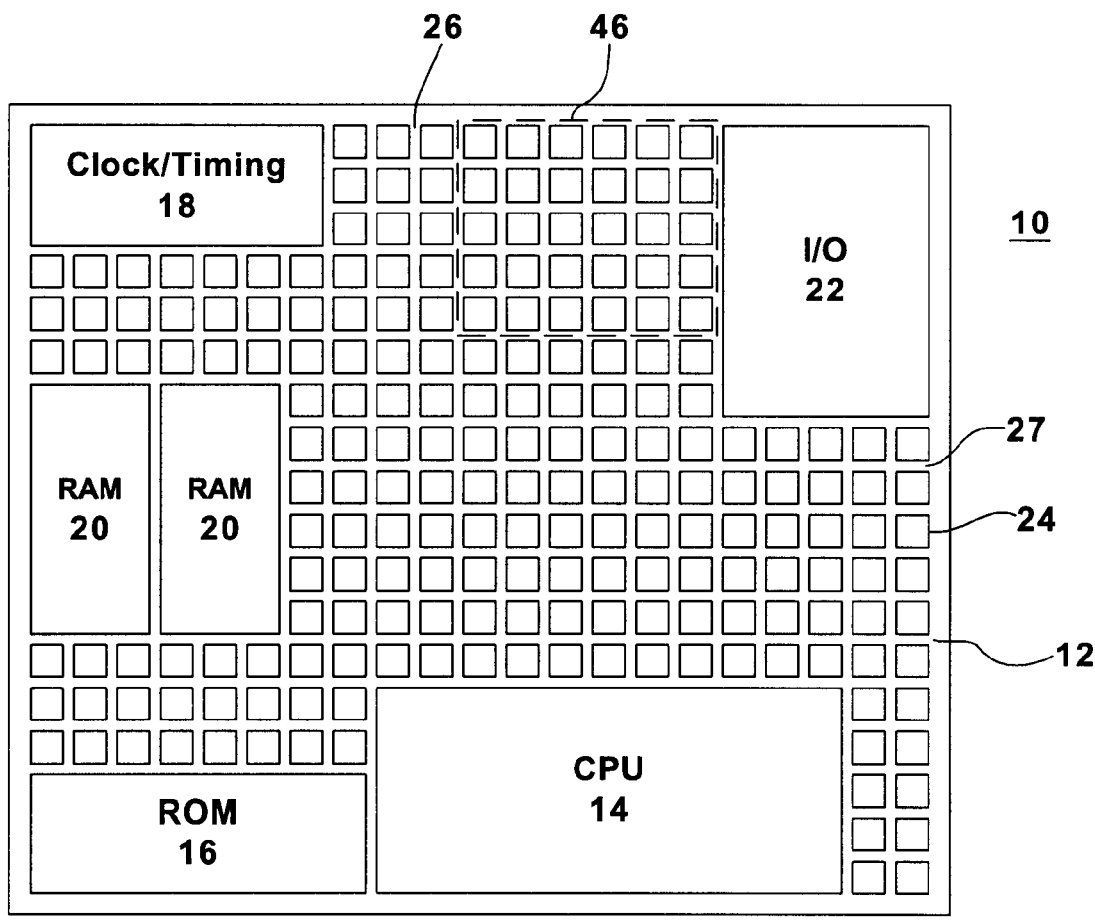
FIG. 1 is a plan view of a surface layout of a semiconductor substrate illustrating the placement of devices on a substrate surface for an integrated circuit.

Referring now to FIG. 1 there is shown an integrated circuit substrate 10 provided on a semiconductor substrate 12, such as a silicon substrate, having a plurality of components thereon. The components of the substrate 12 are preferably made by layering various materials on the substrate 12 in deposit and etch cycles. The arrangement of the components on the substrate 12 is described in terms of a geometric description referred to as a layout, characterized by a plurality of planar geometric shapes separated from one another and arranged in layers on the substrate 12. Masks or patterns corresponding to the layout are used to render desired shapes at desired locations on the substrate 12 in a series of photolithographic steps.

For example, the substrate 12 includes a plurality of functional circuit blocks formed thereon. These circuit blocks may include a central processing unit (CPU) 14, read-only memory (ROM) 16, clock/timing unit 18, random access memory (RAM) 20, and input/output interface (I/O) 22. The integrated circuit 10 substrate 12 preferably includes numerous (e.g., from about 10,000 to several million) cells 24. The cells 24 and the other components of the integrated circuit 10 more specifically described above are interconnected or routed according to a desired logical design of the integrated circuit 10 corresponding to a predetermined application or function. The routing or interconnection between the cells 24 is accomplished by electrically conductive lines or traces formed during the photolithographic steps and located such as in vertical channels 26 and horizontal channels 27 between the cells 24.

Each cell 24 corresponds to a logic element, such as a gate, or to a combination of logic elements interconnected to perform a specific function. For example, and with reference to FIG. 2, there is shown a logic tree 28 defined by a plurality of logic cells 30a–f (FIG. 3). Each logic cell 30a–f is preferably one of the cells 24 having an output pin provided by a standard logic gate. The logic cells illustrated in FIGS. 3a–3f, provide representative examples of standard logic gates such as AND gate 30a, NAND gate 30b, NOT gate 30c, OR gate 30d, NOR gate 30e, and XOR gate 30f. Other logic gates include INV, FD1, AOI and the like.

Figure 2:
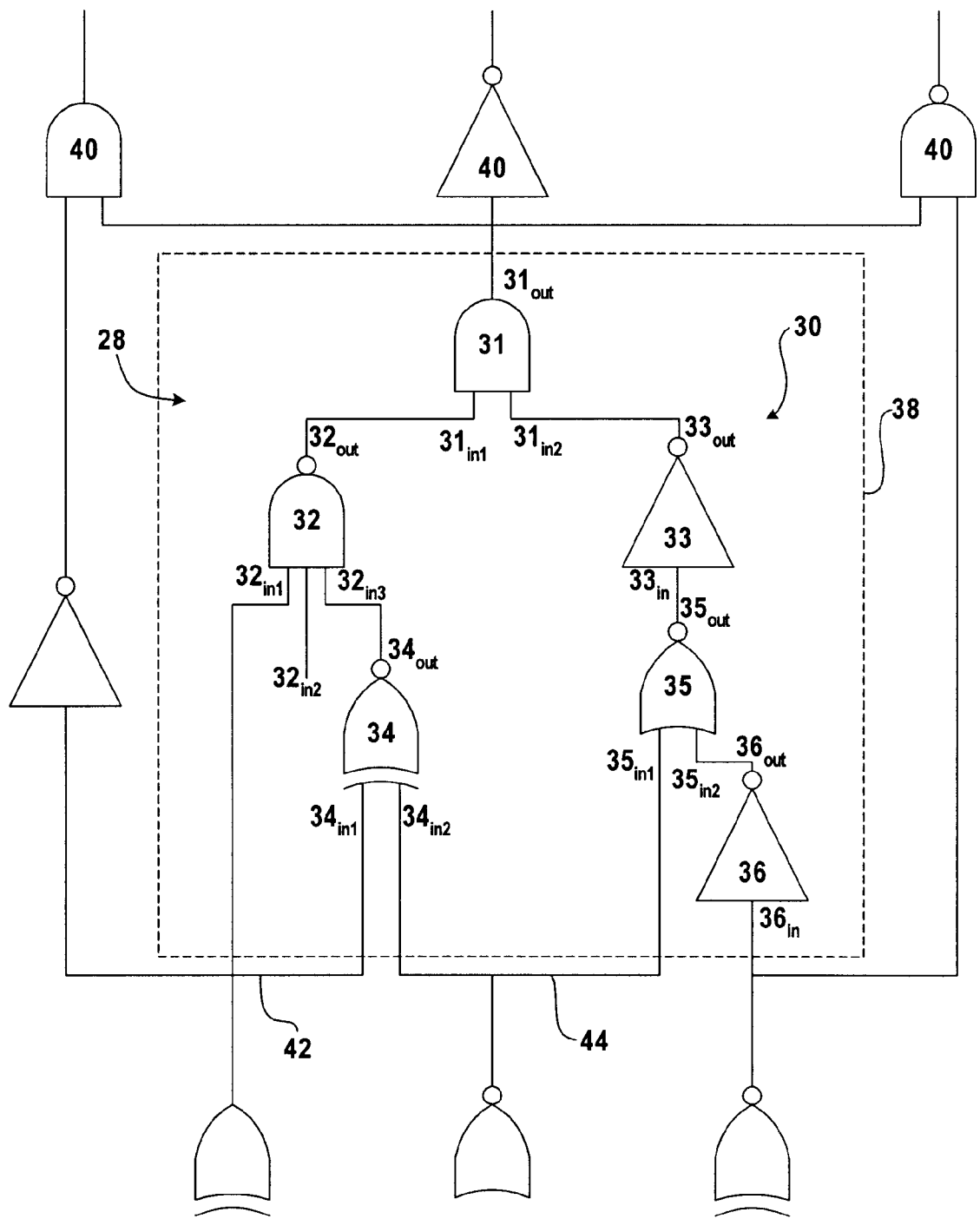
FIG. 2 is a diagrammatic view of a logic tree containing cells or logic gates for an integrated circuit.
Figure 3A:
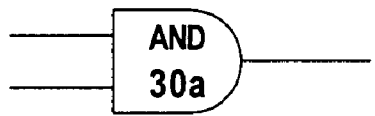
FIGS. 3a–3f are diagrammatic views of logic gates for use in logic functions for an integrated circuit according to the invention.
Figure 3B:
Figure 3C:
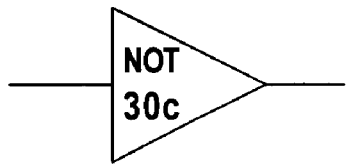
Figure 3D:
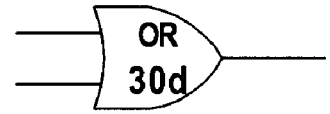
Figure 3E:
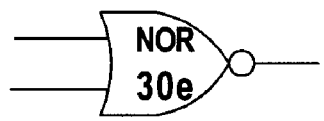
Figure 3F:
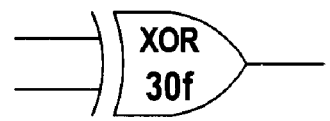

As an example, and with additional reference to FIG. 2, logic tree 28 includes six cells 31–36 located within an imaginary rectangle 38 indicated in dashed lines. Each of the cells 31–36 preferably has a single output pin, designated $31_{out}$–$36_{out}$, respectively. Each of the cells 31–36 also has one or more input pins. For example, cell 31 has input pins $31_{in1}$, and $31_{in2}$. Cell 32 has input pins $32_{in1}$, $32_{in2}$, and $32_{in3}$. In the same manner, cells 33–36 respectively have input pins $33_{in}$, $34_{in1}$, $34_{in2}$, $35_{in1}$, $35_{in2}$, and $36_{in}$.

The output pins of the cells 32–36 each preferably connect to a single input pin, namely an input pin of another of the cells 31–33 and 35. The output pin of the cell 31 does not connect to any input pin of any of the cells within the tree 28. Because of this, the cell 31 is referred to as the root of the logic tree 28. The output pin of the root cell 31 can be connected with any number of input pin cells, such as the input pins of cells such as cells 40, located outside of the rectangle 38. The input pins $32_{in1}$, $34_{in1}$, $35_{in1}$, and $36_{in}$ are connected with cells located outside of the tree 28 and are referred to as entrances to the tree.

The input values of the entrances connected with a wire are preferably identical to one another. That is, pins $32_{in1}$ and $34_{in1}$ are connected by wire 42 and have the same input value, and the pins $34_{in2}$ and $35_{in1}$ are connected by wire 44 and have the same input value. An integrated circuit 10 typically includes hundreds of thousands of logic trees 28 to provide the desired functionality of the integrated circuit 10. Testing of the integrated circuit 10 is conducted by inputting test vectors to the input output (I/O) pins of the integrated circuit 10. Since there is not enough surface space available on an integrated circuit 10 substrate 12 to provide I/O pins for each of the logic trees 28 of the integrated circuit 10, the logic trees 28 are interconnected based on the desired functionality of the integrated circuit 10.

Each functional unit of an integrated circuit 10 according to the invention is about 9.45 microns long by about 3.15 microns wide (i.e., LSI Logic, Inc.'s 0.18 micron technology). For any integrated circuit layout design there exists free space or unused cells between adjacent functional units which are not configured for use in the integrated circuit. A backfill method is applied to the free space in the integrated circuit layout to provide units for use in constructing logic functions. There are typically tens of thousands of multi-unit sites or contiguous units in a multi-million gate layout design. Functional units for use in improving the fault coverage of the chip may be made from the backfill units without changing the size of the die. The backfill units are free to be programmed at the metal level to be predetermined logical units.

After the integrated circuit is completely designed, the backfill multi-unit sites can be used to implement relatively minor changes in the netlist to improve the fault coverage as described in more detail below. The changes in the netlist only require changes at the metal level which includes a relatively inexpensive metallization process. The changes in the netlist may also be implemented in the original metallization process for no additional cost. Hence, the need to provide an expensive new mask set for an integrated circuit revision process is avoided. The netlist is typically edited manually with the backfill multi-unit sites as needed to improve the fault coverage. The multi-unit sites locations and interconnections to nodes are selected with existing simulation tools.

Figure 4:
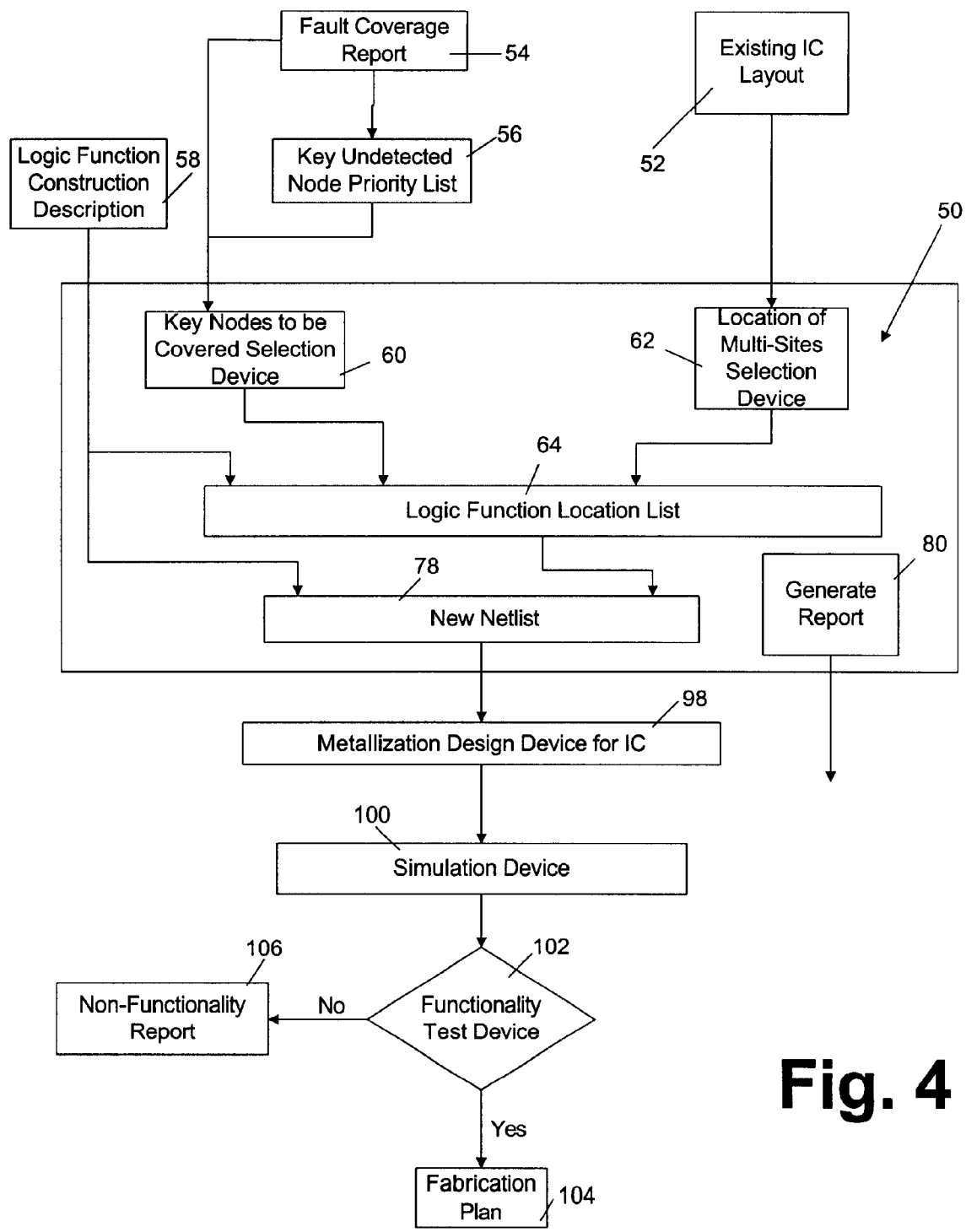
FIG. 4 is a schematic representation of a tool for improving fault coverage of an integrated circuit according to the invention.

With reference now to FIG. 4, a method and tool for implementing fault coverage improvement for an integrated circuit such as an ASIC is described. The method includes the use of a fault coverage improvement tool 50. Inputs to the tool 50 include an existing integrated circuit layout design 52, a fault coverage report 54 which provides a priority list 56 of key undetected nodes. Another input to the tool 50 includes a description 58 of logic functions constructed from multi-units sites in the free space of the integrated circuit layout.

The tool 50 reads the priority list 56 and description list 58 of logic functions, the fault coverage report 54 and the existing integrated circuit layout design 52. The tool then selects key nodes to be covered by use of the key nodes selection device 60 and the distribution and location of adjacent available multi-unit sites is provided by the site distribution device 62. During the key nodes to be covered selection process, the key nodes are prioritized and the first priority key nodes to be covered are selected first as a first priority node set in the event there is insufficient free space to cover all of the undetected nodes. The selected key nodes and adjacent multi-unit sites are combined with the description list 58 of the logic functions to provide a logic function location list 64. Determination of the logic function location list 64 includes consideration of the distribution of multi-unit sites for logic function building and the proximity of the multi-unit sites to the undetected nodes to be covered. It is preferred that the first priority key nodes are connected to the closest multi-unit sites determined by the tool 50.

A suggestion of the type of logic function and connection type such as scan FF or multiplexor to be used for interconnecting the selected key nodes set is provided in the description list 58. An operator also provides a description of how to integrate the scan chain or multiplexor into the existing netlist for the integrated circuit. In other words, an operator may override the tool output in terms of defining the sequence of nodes. For example, if a new scan chain is provided by the tool 50 to interconnect key nodes covered with logic functions, a description of how the new scan chain is linked to existing scan chains is provided so that the new scan chain are compatible with the chip I/O logic. The new scan chain may also be inserted in an existing scan chain as a scan block. The location within the existing scan chain is selected so that the beginning and end of the new scan chain is linked in the proper location to the existing scan chain. If a multiplexor is provided by the tool 50 to interconnect the key nodes, the operator provides how the select decode is to be done in terms of number of select addresses to be sequenced through, how the select decode is sequenced and whether the multiplexor is a hierarchical or flat multiplexor.

Figure 5:
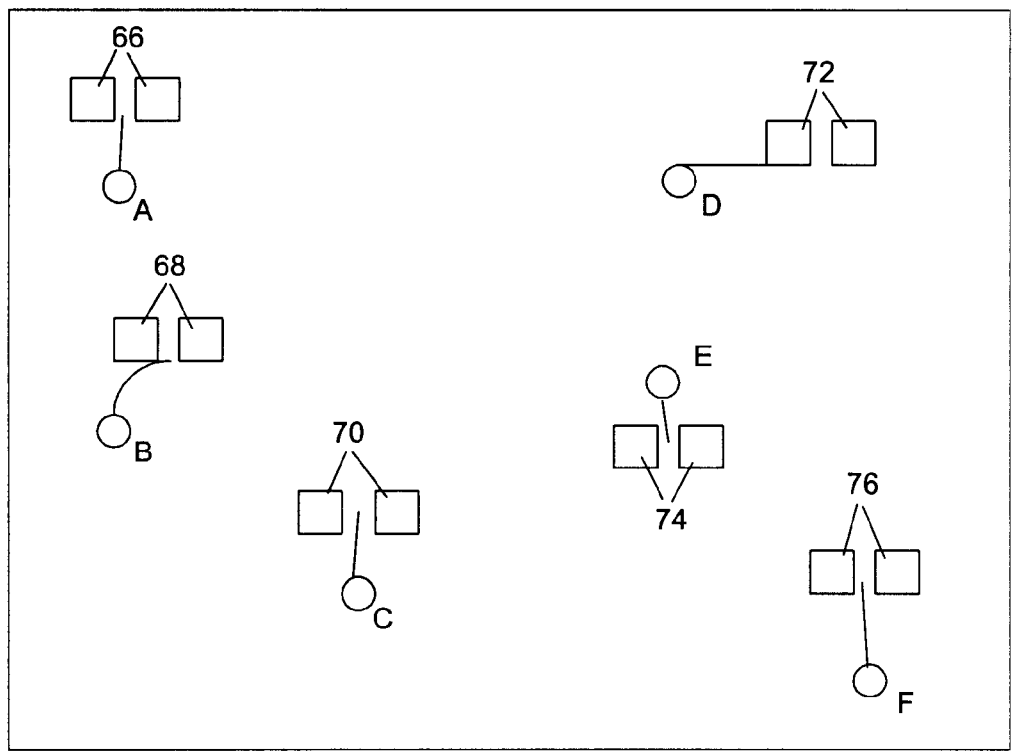
FIG. 5 is a schematic representation of a method for covering undetected nodes according to the invention.

An example of a first priority key nodes set A, B, C, D, E and F to be covered by multi-unit sites 66, 68, 70, 72, 74 and 76 is illustrated in FIG. 5. As shown, the available multi-unit sites 66–76 are selected which are closely adjacent to the key nodes set A–F to be covered. If such multi-unit sites are unavailable, the key nodes may remain uncovered. However, with typical integrated circuit layout designs, there is usually sufficient free space to provide multi-unit sites sufficient to cover at least the first priority key undetected nodes.

Figure 6:
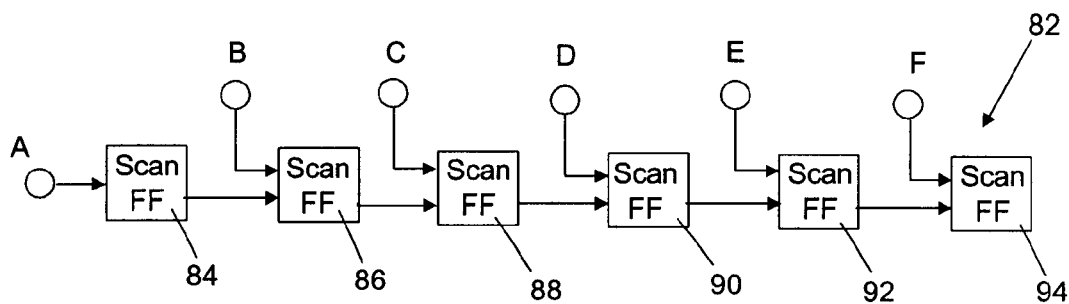
FIG. 6 is a schematic representation of a scan chain of functional units connected to undetected nodes according to the invention.
Figure 7:
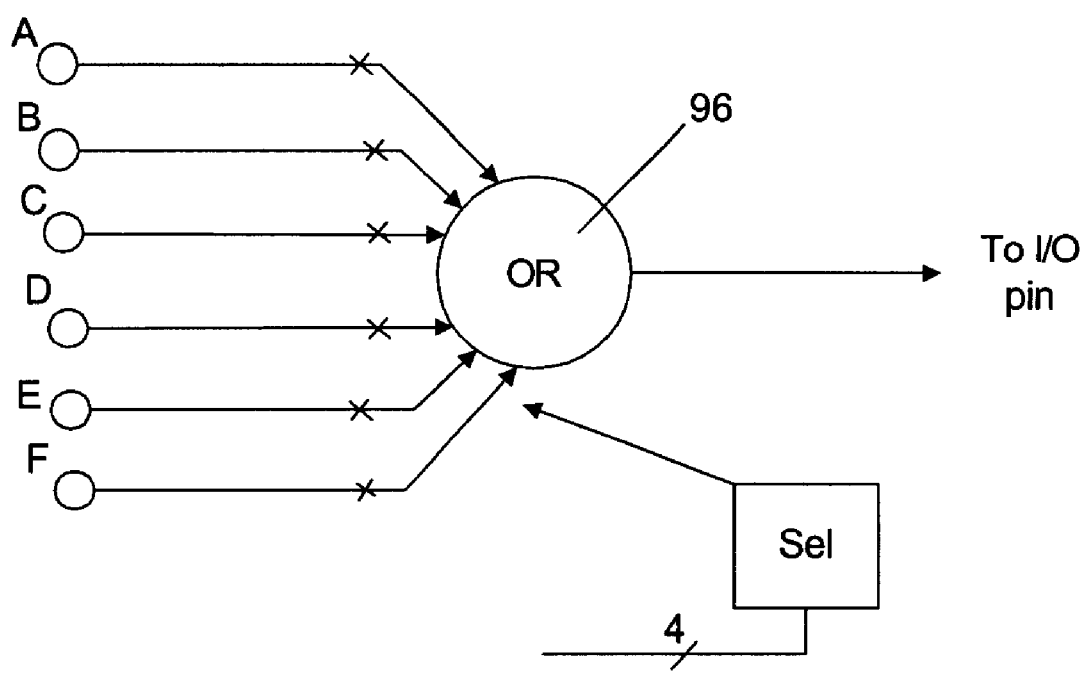
FIG. 7 is a schematic representation of a multiplexor which may be used to connected undetected nodes to an input output pin according to the invention.

Use of the logic functions description 58 and logic function location list 64 is used to generate a new netlist 78 and a node coverage report 80. The new netlist 78 includes connection to the logic functions added according to the logic function location list 64 and multiplexors or scan chains provided to access the added logic functions. A scan chain 82 for key undetected nodes set A–F and corresponding logic functions 84–94 is illustrated in FIG. 6. The key nodes set A–F may also be connected to an I/O pin through a multiplexor 96 as illustrated in FIG. 7.

The report 80 designates the undetected nodes from the priority list of key nodes to be covered and a list of unobserved nodes covered and unobserved nodes not covered by use of the tool 50. Report outputs also include the total number of multi-unit sites provided by backfilling the free space on the substrate, the number of logic functions to be built from the multi-unit sites, the number of logic functions to be used to cover the key nodes, the number of remaining multi-unit sites once the key nodes are covered and the farthest distance from the adjacent multi-unit sites to the key nodes to be covered. The report also suggests how more nodes could be covered as by use of multiplexors 96 if there are insufficient multi-unit sites available to link all of the added logic functions to an I/O pin, or the report may suggest covering more nodes by the use of scan, partial scan or partial multiplexing. At any point in the process after generating a new newlist 78, the inputs to the tool 50 may be modified, or optionally the tool can be re-run, to provide a different node coverage report 80 for the undetected nodes.

Once the new netlist 78 is generated, a metallization design for the integrated circuit is provided by design device 98. The metallization-design includes connections to the added logic functions. Since the tool may be applied before or after tapeout, changes to the metallization design may be implemented to make small changes to the netlist even after the integrated circuit is built. Changes to the integrated circuit including only changes to the metal layers to use available multi-unit sites is a relatively inexpensive means for implementing minor changes to improve the integrated circuit function and fault coverage.

Once the metallization design is complete, an integrated circuit simulation is conducted by simulation device 100 to determine if the integrated circuit meets a predetermined functionality. If the functionality of the integrated circuit is met, functionality test device 102 provides an output to a fabrication plan 104 to complete the fabrication of the integrated circuit. If the functionality of the integrated circuit is not met, functionality test device 102 provides a report 106 which enables an operator to make changes to the inputs to the tool 50 in order to achieve the predetermined functionality and improved fault coverage.

Implementation of the tool 50 described above on a DVD chip, such as L64021 manufactured by LSI Logic, Inc., can provide up to 100% fault coverage. For example, the DVD chip has 569,406 total faults with 3,011 unobserved faults. The undetected faults may be covered with 20,000 gates (logic functions) which can be distributed throughout the chip layout. The 3,011 unobserved faults may be covered by an additional scan chain or with a multiplexor of the associated nodes to signal pins, if the signal pins exist. By covering all of the associated nodes with logic functions, 100% fault coverage can be achieved. Such coverage can ensure a minimum number of returned chips which will generate savings in production costs for reworking the chip or for using a second coverage tool to achieve a target fault coverage level.

The tool 50 may also be used to provide coverage for undetected nodes uncovered in a failure analysis, even if the node were not on the priority list of uncovered nodes if coverage of the nodes would reduce returns of defective integrated circuits. The nodes detected in the failure analysis can be added to the priority list 56 of undetected nodes and logical functions added to cover the nodes.

Optionally, nodes that are covered by the fault coverage report, but take many vectors to cover, may also be candidates for connection to logical functions provided in the multi-units sites added in the free space of the integrated circuit layout. Hence the tool 50 is adaptable to review the fault coverage of covered nodes and the number of vectors required to cover the nodes and provide a logic function list for covering the nodes in order to reduce the run time of vectors for the fault coverage report generation.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for increasing a fault coverage of an integrated circuit having a predetermined functionality, the method comprising the steps of:

providing an integrated circuit layout on a substrate including functional units, free space and a first netlist, providing a fault grading report output for the integrated circuit layout including a number of unobserved faults and identified undetected nodes, providing a priority task list for the integrated circuit layout of key undetected nodes from the identified undetected nodes, selecting key undetected nodes of the integrated circuit layout to be covered with logic functions, selecting multi-unit sites of the integrated circuit layout in the free space adjacent the key undetected nodes to provide a locations list for the logic functions for connection to the key undetected nodes, and generating a second netlist for the integrated circuit layout including the locations list for the logic functions.

2. The method of claim 1 further comprising:

generating a metallization design for the integrated circuit according to the second netlist, and running an integrated circuit simulation to determine if the predetermined desired functionality for the integrated circuit is achieved.

3. The method of claim 1 wherein the integrated circuit is an application specific integrated circuit.

4. The method of claim 1 wherein the integrated circuit contains sufficient free space to provide 100% fault coverage by connecting multi-unit sites in the free space with undetected nodes.

5. The method of claim 1 wherein the second netlist is generated prior to tapeout.

6. The method of claim 1 wherein the second netlist is generated subsequent to tapeout.

7. The method of claim 1 wherein the key undetected nodes are linked to one another by a logic function scan chain.

8. The method of claim 1 wherein the key undetected nodes are linked to one another by a logic function scan chain and the logic function scan chain comprises a set of flip-flops.

9. The method of claim 1 wherein the key undetected nodes are linked to one another by a multiplexor.

10. The method of claim 1 further comprising reducing a number of vectors required for fault coverage of key detected nodes by providing multi-unit sites for logic function locations adjacent the key detected nodes, and generating a third net list to be included in the metallization design for the integrated circuit.

11. An integrated circuit having fault coverage improvement in accordance with the method of claim 1.

12. A method for fabricating an integrated circuit having a predetermined functionality, comprising the steps of:

providing an integrated circuit layout on a substrate including functional units, free space and a first netlist, running a fault grading test for the integrated circuit layout to provide a fault grading report for the integrated circuit layout, the fault grading report including a number of unobserved faults and identified undetected nodes, generating a priority task list for the integrated circuit layout of key undetected nodes from the identified undetected nodes, selecting key undetected nodes of the integrated circuit layout to be covered with logic functions, selecting multi-unit sites of the integrated circuit layout in the free space adjacent the key undetected nodes to provide a locations list for the logic functions for connection to the key undetected nodes, generating a second netlist for the integrated circuit layout including the locations list for the logic functions, generating a metallization design for the integrated circuit according to the second netlist, running an integrated circuit simulation to determine if the predetermined desired functionality for the integrated circuit is achieved, and building the integrated circuit based on the metallization design.

13. The method of claim 12 wherein the integrated circuit is an application specific integrated circuit.

14. The method of claim 12 wherein the integrated circuit contains sufficient free space to provide 100% fault coverage by connecting multi-unit sites in the free space with undetected nodes.

15. The method of claim 12 wherein the key undetected nodes are linked to one another by a logic function scan chain.

16. The method of claim 12 wherein the key undetected nodes are linked to one another by a logic function scan chain and the logic function scan chain comprises a set of flip-flops.

17. The method of claim 12 wherein the key undetected nodes are linked to one another by a multiplexor.

18. The method of claim 12 further comprising reducing a number of vectors required for fault coverage of key detected nodes by providing multi-unit sites for logic function locations adjacent the key detected nodes, and generating a third net list to be included in the metallization design for the integrated circuit.

19. An integrated circuit having fault coverage improvement in accordance with the method of claim 12.

20. A tool for increasing fault coverage of an integrated circuit, comprising:

a key nodes detection device for matching key nodes to a fault grading report list of undetected nodes of the integrated circuit, a multi-sites selection device for reading a layout file of available multi-unit sites for the integrated circuit, a site matching device for matching available multi-unit sites to key undetected nodes for the integrated circuit, and a netlist generation device for building logic functions in the available multi-unit sites for connection to the key undetected nodes.

21. The tool of claim 20 further comprising a report device for generating a report containing a list of undetected nodes connected to the logic functions.

* * * * *